United States Patent
Iwaida et al.

(10) Patent No.: US 6,294,244 B1
(45) Date of Patent: Sep. 25, 2001

(54) WIRING BOARD HAVING EXCELLENT HEAT-RADIATING PROPERTY

(75) Inventors: Toshihiro Iwaida; Teruhisa Makino; Masanobu Ishida; Tomohide Hasegawa; Hirosi Okayama, all of Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/217,087

(22) Filed: Dec. 21, 1998

(30) Foreign Application Priority Data

Dec. 22, 1997 (JP) .................................................. 9-352949
Apr. 27, 1998 (JP) .................................................. 10-116964
Jul. 30, 1998 (JP) .................................................. 10-215842
Sep. 29, 1998 (JP) .................................................. 10-276184

(51) Int. Cl.⁷ .................................................. B32B 18/00
(52) U.S. Cl. .................... 428/209; 428/337; 428/450; 428/697; 428/698; 428/901; 501/97.3; 501/108; 501/154
(58) Field of Search .................. 428/698, 699, 428/446, 450, 209, 469, 472, 901, 337; 501/97.1, 97.2, 97.3, 108, 154

(56) References Cited

U.S. PATENT DOCUMENTS

| | | | |
|---|---|---|---|
| 5,316,856 | * | 5/1994 | Suzuki et al. .................... 428/446 |
| 5,439,856 | * | 8/1995 | Komatsu .............................. 501/97 |
| 5,912,066 | * | 6/1999 | Takahashi ............................ 428/195 |
| 5,998,000 | * | 12/1999 | Ikeda et al. .......................... 428/210 |
| 6,086,990 | * | 6/2000 | Sumino et al. ...................... 428/336 |
| 6,110,596 | * | 8/2000 | Kasori et al. ........................ 428/428 |

FOREIGN PATENT DOCUMENTS

| | | | |
|---|---|---|---|
| 404125950A | * | 4/1992 | (JP) . |
| 407149588A | * | 6/1995 | (JP) . |
| 408319187A | * | 12/1996 | (JP) . |
| 409069672A | * | 3/1997 | (JP) . |

* cited by examiner

Primary Examiner—Blaine Copenheaver
Assistant Examiner—Stephen Stein
(74) Attorney, Agent, or Firm—Hogan & Hartson L.L.P.

(57) ABSTRACT

A wiring board of the present invention is equipped with an insulating board formed of a sintered product of silicon nitride containing a silicon nitride crystal phase, and a metal circuit formed on said insulating board, wherein said sintered product of silicon nitride contains a rare earth element (RE) and magnesium in a total amount of from 4 to 30 mol % calculated as oxides and at a molar ratio ($RE_2O_3/MgO$) calculated as oxides of from 0.1 to 15, and has a relative density of not smaller than 90% and a heat conductivity of not smaller than 50 W/m·K. The wiring board is equipped with the insulating board having very excellent heat-radiating property and a large strength, and is very useful as a wiring board for, for example, power modules.

11 Claims, 1 Drawing Sheet

WIRING BOARD HAVING EXCELLENT HEAT-RADIATING PROPERTY

BACKGROUND OF THE INVENTION

1. Field of the Invention

The present invention relates to a wiring board equipped with an insulating board which is made of a sintered product of silicon nitride having excellent heat-radiating property.

2. Description of the Prior Art

Accompanying the trend toward highly densely integrating the semiconductor elements in recent years, heat is generated in large amounts from a semiconductor device mounting the semiconductor elements, and it is becoming necessary to quickly radiate the heat out of the device so that the semiconductor device will not erroneously operate. For example, a power module equipped with a so-called power device such as MOSFET or IGBT has been used as a control board for electrically powered vehicles such as electric trains and electric cars. Such a control board deals with an electric current of several tens to several hundreds of amperes and a voltage of several hundreds of volts to supply a very large electric power. Therefore, the power device generates large amounts of heat arousing a serious problem in regard to how the heat that is generated be radiated out of the system to prevent the device from malfunctioning.

An insulating board made of a sintered product of alumina has heretofore been used for a package for containing the semiconductor elements or for a wiring board provided in a semiconductor device. However, the sintered product of alumina has a heat conductivity of as small as about 20 W/m·K and is not satisfactory from the standpoint of radiating the heat. Therefore, attention has been given to a sintered product of aluminum nitride having a high heat conductivity to substitute for the sintered product of alumina. However, the sintered product of aluminum nitride has such defects as a small strength and a small breaking toughness. That is, the semiconductor device equipped with an insulating board made of a sintered product of aluminum nitride cannot be used for a part that is subjected to a large stress and for which a high reliability is required even under severe conditions of use, such as the above-mentioned control board mounted on the electrically powered vehicles.

In recent years, the sintered product of silicon nitride is drawing attention as a material having a high heat conductivity and a large strength. Study has been conducted vigorously concerning the sintered product of silicon nitride as a high-temperature structural material (e.g., gas turbine) which must have a strength at high temperatures, and part of the study is arriving at a practicable region. That is, the sintered product of silicon nitride used as a high-temperature structural material exhibits excellent strength at high temperatures and a considerably high heat conductivity owing to its crystalline structure.

To obtain the sintered product of silicon nitride for use as the above-mentioned high-temperature structural material, however, it is necessary to use an oxide of a the firing at a temperature which is as very high as 1800 rare earth element as a sintering assistant and to execute to 2000° C. to maintain a large strength at high temperatures. In order to suppress the decomposition reaction of the silicon nitride at high temperatures, furthermore, the firing must be conducted in a nitrogen atmosphere under a pressure of from several tens to a hundred atms. Accordingly, the study related to the radiation of heat of the sintered product of silicon nitride has been conducted in connection with, chiefly, those obtained through the firing at high temperatures under elevated pressure conditions. Heat-radiating properties of the sintered product of silicon nitride obtained through the firing at temperatures of not higher than 1800° C. have not almost been reported. In other words, it has been known merely that a sintered product of silicon nitride can be obtained by using, as a sintering assistant, an oxide of a rare earth element and alumina through the firing at a temperature which is as relatively low as 1700 to 1800° C., but its properties have not almost been known.

For example, Japanese Unexamined Patent Publications (Kokai) Nos. 135771/1994 and 149588/1995 teach sintered products of silicon nitride having heat conductivities of not smaller than 60 W/m·K and excellent heat-radiating properties by using at least an oxide of a rare earth element as a sintering assistant and through the firing in nitrogen under an elevated pressure at 1800 to 2000° C. Japanese Unexamined Patent Publication (Kokai) No. 219731/1992 discloses a sintered product containing not less than 90% by weight of silicon nitride, containing aluminum and oxygen in amounts not larger than 3.5% by weight, respectively, having a density of not smaller than 3.15 g/cm$^3$ and having a heat conductivity of not smaller than 40 W/m·K.

As described earlier, the sintered products of silicon nitride of the above-mentioned prior arts are obtained by a special firing method, i.e., firing in nitrogen under an elevated pressure condition at a temperature of not lower than 1800° C., involving a defect of high firing cost. Despite the firing is conducted in nitrogen under an elevated pressure condition, it is difficult to completely suppress the decomposition of the silicon nitride. Therefore, the fired surface (as fired surface) of the product is very coarsened, requiring a cumbersome machining work such as polishing after the firing, resulting in a further increase in the cost of production.

On the other hand, the sintered product of silicon nitride obtained through the firing at a low temperature which is not higher than 1800° C. is free from the problem in that the silicon nitride is decomposed during the firing. Therefore, this sintered product of silicon nitride is obtained through the firing in a non-oxidizing atmosphere under normal pressure (atmospheric pressure), offering such advantages that the cost of firing is cheap and the fired surface (as fired surface) is coarsened little. However, the sintered product of silicon nitride obtained through the firing at such a low temperature has a heat conductivity of from 20 to 30 W/m·K and radiates the heat in amounts considerably smaller than that obtained through the firing at a high temperature, which is a fatal defect. That is, when the sintered product of silicon nitride is produced through the firing at a low temperature, there are used an oxide of a rare earth element and alumina as sintering assistants, whereby aluminum atoms dissolve as a solid solution in the crystalline particles of silicon nitride to form sialon. As a result, the silicon nitride crystals exhibit a decreased heat conductivity.

On account of these reasons, the wiring board equipped with the insulating board of a sintered product of silicon nitride prepared through the firing at a low temperature, is far from being put into a practical use.

SUMMARY OF THE INVENTION

It is therefore an object of the present invention to provide a wiring board equipped with an insulating board made of a sintered product of silicon nitride prepared through the firing under normal pressure at a temperature of not higher than 1800° C., and having excellent heat-radiating property and strength.

Another object of the present invention is to provide a wiring board for a device that is used under a severe condition and that requires a high reliability, for example, a control board mounted on vehicles.

Still another object of the present invention is to provide a method of producing an insulating board having excellent heat-radiating property and strength by using a silicon nitride powder and firing at a low temperature which is not higher than 1800° C.

According to the present invention, there is provided a wiring board equipped with an insulating board formed of a sintered product of silicon nitride containing a silicon nitride crystal phase, and a metal circuit formed on said insulating board, wherein said sintered product of silicon nitride contains a rare earth element (RE) and magnesium in a total amount of from 4 to 30 mol % calculated as oxides and at a molar ratio ($RE_2O_3$/MgO) calculated as oxides of from 0.1 to 15, and has a relative density of not smaller than 90% and a heat conductivity of not smaller than 50 W/m·K.

According to the present invention, there is further provided a method of producing an insulating board comprising:

mixing a powder of silicon nitride, a powder of a compound of a rare earth element and a powder of a magnesium compound together such that the content of the silicon nitride is from 70 to 95 mol %, a total amount of the rare earth element (RE) and magnesium is from 4 to 30 mol % calculated as oxides, and a molar ratio ($RE_2O_3$/MgO) calculated as oxides is from 0.1 to 15, thereby to prepare a mixture powder thereof;

mixing an organic binder and a solvent into said mixture powder to prepare a slurry thereof;

molding a sheet-like article by using said slurry; and firing said molded article, after dewaxing, in a non-oxidizing atmosphere at a temperature of from 1500 to 1800° C. so as to possess a relative density of not smaller than 90%.

Figure 1:
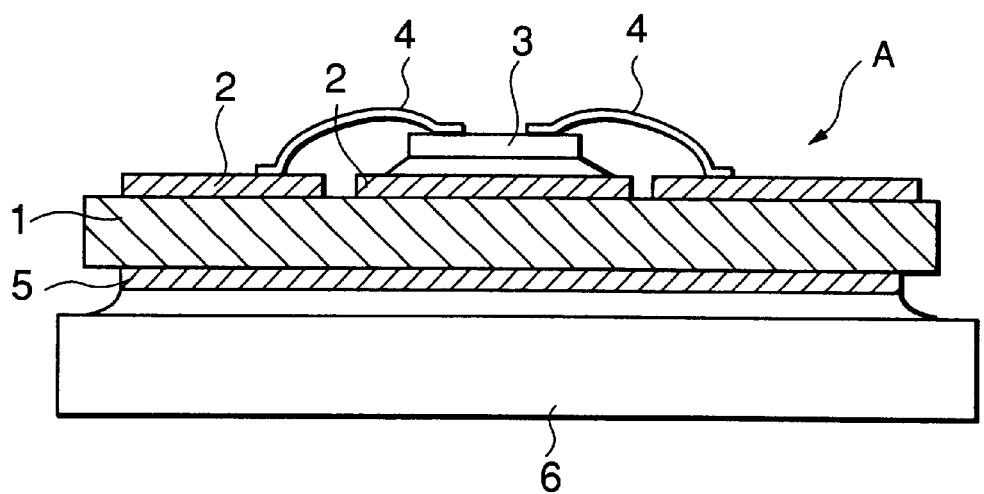
FIG. 1 is a side sectional view schematically illustrating the structure of a wiring board for a power module.

DETAILED DESCRIPTION OF THE INVENTION (Insulating Board)

It is important that the wiring board of the present invention is equipped with an insulating board formed of a particular sintered product of a silicon nitride. The insulating board has a heat conductivity of not smaller than 50 W/m·K, radiates heat very excellently, and has a large strength such as a three-point bending strength (JIS-R-1601) at room temperature of not smaller than 700 MPa and, particularly, not smaller than 750 MPa.

The sintered product of silicon nitride that constitutes the insulating board contains, as a chief crystal phase, columnar crystals of silicon nitride that is α-β transited upon the firing and, particularly, contains a rare earth element (RE) and magnesium in predetermined amounts. That is, a total amount of the rare earth element and magnesium is from 4 to 30 mol % and, preferably, from 5 to 25 mol % calculated as oxides, and the molar ratio ($RE_2O_3$/MgO) calculated as oxides is from 0.1 to 15 and, preferably, from 0.5 to 13.

Therefore, the insulating board not only has a high heat conductivity and a large strength but also can be produced through the firing at a low temperature of not higher than 1800° C. offering a great advantage from the standpoint of cost.

The rare earth element and magnesium stem from a compound of rare earth element and a compound of magnesium used as sintering assistants. During the firing, the compounds of these elements react with oxygen which is an impurity in the starting material of silicon nitride to form a liquid phase which promotes the sintering. As a result, silicon nitride can be sintered at a temperature of not higher than 1800° C. Moreover, the rare earth element present in the liquid phase promotes the crystallization of grain boundary phase; i.e., a glass phase having a small heat conductivity is little formed in the grain boundary phase, and the sintered product exhibits an increased heat conductivity (heating-radiating property). Besides, the rare earth element enhances the aspect ratio of the columnar crystals formed due to the α-β transition of silicon nitride, so that the sintered product that is obtained exhibits an improved breaking toughness. Upon containing the rare earth element and magnesium stemming from the sintering assistants maintaining a predetermined balance as described above, the sintered product of silicon nitride that constitutes the insulating board is obtained through the firing under normal pressure at a low temperature which is not higher than 1800° C., the sintered product of silicon nitride having a high heat conductivity of not smaller than 50% and excellent mechanical properties such as strength and the like. When the total amount of the rare earth element and magnesium calculated as oxides is smaller than, for example, 4 mol %, it becomes difficult to obtain a sufficiently dense sintered product through the firing at a temperature of not higher than 1800° C. When the total amount thereof exceeds 30 mol %, on the other hand, the absolute amount of the grain boundary phase in the sintered product increases resulting in a decrease in the heat conductivity (heat-radiating property). When the molar ratio ($RE_2O_3$/MgO) of the rare earth element and magnesium calculated as oxides exceeds 15 or becomes smaller than 0.1, furthermore, it becomes difficult to increase the density upon the firing at a low temperature of not higher than 1800° C. and the heat conductivity decreases, too.

The insulating board can be produced through the firing by using the above-mentioned rare earth element compound and magnesium compound in combination with an aluminum compound such as alumina as sintering assistants. In this case, however, the content of aluminum calculated as an oxide in the sintered product should not be larger than 1.0 mol %, preferably, not larger than 0.5 mol %, more preferably, not larger than 0.1 mol % and, most preferably, not larger than 0.01 mol %. That is, the aluminum compound promotes the formation of a liquid phase at low temperatures and is advantageous from the standpoint of conducting the firing at low temperatures. When the aluminum compound is used in large amounts, however, the aluminum atoms dissolve as a solid solution in the crystal phase of silicon nitride to form sialon which interrupts the diffusion of phonons, causing the sintered product to exhibit a greatly decreased heat conductivity. From the standpoint of obtaining an insulating board having a high heat conductivity, therefore, it is desired that the aluminum content is as small as possible.

In the sintered product constituting the above-mentioned insulating board, it is desired that the columnar crystals of β-silicon nitride constituting the main crystal phase have an average long-axis diameter of from 0.5 to 3 μm and, particularly, from 0.5 to 2.0 μm from the standpoint of improving heat-radiating property and strength. When the long-axis diameter becomes greater than 3 μm, the content of coarse particles that become a source of destruction increases causing the sintered product to lose its strength. When the long-axis diameter becomes smaller than 0.5 μm, on the other hand, the heat conductivity tends to decrease making it difficult to obtain a sintered product having a heat conductivity of, for example, not smaller than 50 W/m·K. It is further desired that an average aspect ratio of columnar crystals of β-silicon nitride is from 1.2 to 4 and, particularly, from 1.5 to 3.5 from the standpoint of improving the strength and heat conductivity of the sintered product simultaneously.

The long-axis diameter and average aspect ratio of the columnar crystals can be adjusted within a range of a certain degree by using a compound of a rare earth element as a sintering assistant and by adjusting the firing time. In order to set the long axis-diameter within the above-mentioned range, in particular, it is desired that the relative density of the molded article for producing the sintered product is adjusted to lie within a predetermined range. This will be described later.

In the present invention, the rare earth element and magnesium stemming from the above-mentioned sintering assistants may partly dissolve as a solid solution in the main crystal phase but mostly exist in the grain boundary phase.

During the firing, for example, the rare earth element (RE) exists in the liquid but is finally precipitated as a crystal phase like $RE_2Si_3O_3N_4$, $RE_2SiO_5$, $RE_2Si_2O_7$ in the grain boundary phase. That is, since the rare earth element precipitates in the grain boundary as a crystal phase, the glass phase having a low heat conductivity remains little in the grain boundary, and the sintered product exhibits an improved heat conductivity. Examples of the rare earth element (RE) include Y, La, Ce, Pr, Nd, Pm, Sm, Eu, Gd, Tb, Dy, Ho, Er, Tm, Yb and Lu. Any one of them may be used in the present invention. From the standpoint of cost and properties, however, it is desired to use Y, Ce, Sm, Dy, Er, Yb or Lu among them and, particularly, to use Y or Er.

Magnesium is chiefly contained in the glass phase that remains in the grain boundary. In the present invention, magnesium in the glass phase is crystallized into $MgSiO_3$ or $MgSiN_2$, in order to further decrease the glass phase having a low heat conductivity in the grain boundary and to further improve the heat conductivity of the sintered product. As will be described later, magnesium is easily crystallized by maintaining the sintered product within a predetermined temperature range lower than the firing temperature for a predetermined period of time.

The sintered product may contain other components such as coloring components which may be at least one kind of a metal of the Group of 4a, 5a or 6a of periodic table such as Ti, Hf, Zr, V, Nb, Ta, Cr, Mo or W. In general, it is desired that the coloring components are contained in amounts of from 0.05 to 1% by weight in order to obtain a desired coloring effect without impairing the properties such as strength and heat conductivity of the sintered product.

The sintered product of the above-mentioned composition must have a relative density of not smaller than 90% and, particularly, not smaller than 95%. When the relative density is smaller than 90%, it becomes difficult to enhance the heat conductivity making it no longer possible to obtain a sintered product having a heat conductivity of not smaller than, for example, 50 W/m·K. A higher relative density gives more advantage from the standpoint of heat conductivity and strength resulting, however, in an increase in the Young's modulus. When the relative density becomes not smaller than, for example, 99%, the Young's modulus of the sintered product becomes, generally, not smaller than 350 GPa at room temperature. When a large stress is exerted, the sintered product having such a high Young's modulus develops cracks and is easily broken. For instance, the insulating board in the wiring board for a power module must have a very small thickness (e.g., smaller than 1 mm and, particularly, smaller than 0.8 mm) in order to decrease the heat resistance thereof. Besides, a large load is exerted when a power element and the like are mounted on the insulating board. When the sintered product having a high Young's modulus is used as the insulating board, therefore, the insulating board becomes likely to be easily damaged by the load that is exerted when the power element is mounted. From such a point of view, it is desired that the sintered product constituting the insulating board in the wiring board for a power module has a relative density of from 90 to 98.5% and, particularly, from 95 to 98%. Upon setting the relative density to lie within the above-mentioned range, it is allowed to adjust the Young's modulus (room temperature) of the sintered product to be not larger than 300 GPa and, particularly, to lie within a range of from 250 to 300 GPa without impairing high heat conductivity and large strength. That is, the insulating board formed of a sintered product having such a small Young's modulus deflects to a large extent when a large load is exerted thereon, and the stress therein decreases. This makes it possible to effectively prevent the insulating board from developing cracks or from being damaged at the time when a power element is mounted thereon.

The insulating board used in the present invention is formed of a sintered product of silicon nitride having the above-mentioned composition and has not only a high heat conductivity and excellent heat-radiating property but also a very large strength. The insulating board has a three-point bending strength (JIS-R-1601) at room temperature of, for example, not smaller than 700 MPa and, particularly, not smaller than 750 MPa, and maintains a very high strength despite its thickness is smaller than 1 mm. Therefore, the wiring board of the present invention equipped with such an insulating board is very useful particularly for a power module.

Furthermore, the insulating board is obtained through the firing at a low temperature which is not higher than 1800° C., and does not almost permit silicon nitride to be decomposed during the firing and does not almost permit the fired surface to be coarsened, either. For instance, a maximum surface roughness (Rmax) of the surface as fired is not larger than 10 μm and, particularly, not larger than 7 μm. Therefore, the surface needs not be necessarily polished after firing, which is very advantageous from the standpoint of production cost.

(Preparation of the Insulating Board)

The silicon nitride powder used for preparing the above-mentioned insulating board generally contains $α-Si_3Ni_4$ in amount of not smaller than 90% and, particularly, not smaller than 95% and has an average particle diameter of from 0.1 to 1.5 μm from the standpoint of sintering property. It is further desired that the amount of oxygen which is an impurity in the silicon nitride powder is from 0.5 to 3.0% by weight. When the amount of impurity oxygen is larger than 3.0% by weight, the surface (as fired surface) of the obtained sintered product is coarsened and the strength often decreases. When the amount of impurity oxygen is smaller than 0.5% by weight, the sintering property decreases, and a sintered product having a sufficient degree of density is not obtained through the firing at a temperature of not higher than 1800° C.

The above-mentioned silicon nitride powder is blended with a powder of a rare earth element compound and a powder of a magnesium compound as sintering assistants and, as required, with a powder of an aluminum compound. As required, furthermore, the silicon nitride powder is blended with a powder of a metal compound that is a coloring component as described above and with a filler such as $SiO_2$ powder. The content of the silicon nitride in the mixture powder is from 70 to 95 mol %, and the contents of the rare earth element and of magnesium are so set that the total amount thereof calculated as oxides and the molar ratio thereof calculated as oxides lie in the above-mentioned ranges. When the aluminum compound is used as the sintering assistant, the content of aluminum is so set as to lie within the above-mentioned range (not larger than 1.0 mol %). The coloring component and the filler are suitably used such that the amounts of the silicon nitride powder and the sintering assistant lie within the above-mentioned ranges. The rare earth element compound, magnesium compound and aluminum compound used as sintering assistants are usually in the form of oxides which, however, may be compounds that are capable of forming oxides upon the firing, such as carbonates, acetates, etc. It is further desired that the powders used as sintering assistants and powders used as any other components, have average particle diameters of not larger than 1 μm and purities of not smaller than 99%.

To the thus obtained mixture powder are added a widely known organic binder such as paraffin wax, polyvinyl alcohol or polyvinyl butyral and a widely known organic solvent such as isopropyl alcohol or the like to prepare a slurry from which a sheet-like article (green sheet) is molded relying upon a widely known molding method such as press-molding method, CIP-molding method, doctor blade method, rolling method, tape-molding method, extrusion-molding method or injection-molding method. In this case, the slurry may be passed through a sieve and, then, dried to prepare particles thereof from which the green sheet is prepared.

Depending upon the structure of the insulating board in the wiring board, furthermore, the green sheet may be provided with through-holes which are then filled with an electrically conducting paste, or the surface thereof may be printed with a circuit pattern of an electrically conducting paste such as of Cu, W, Mo—Mn, Mo or Pd—Ag by the screen-printing method. Furthermore, plural pieces of green sheets may be laminated one upon the other.

The thus obtained molded article (green sheet) is subjected to the binder-removing treatment at a predetermined temperature and is, then, subjected to the firing. As described earlier, however, in order to adjust the average long-axis diameter of the columnar crystals of silicon nitride in the obtained sintered product to lie from 0.5 to 3.0 μm and, particularly, from 0.5 to 2.0 μm, it is desired that the relative density of the molded article after the binder is removed is adjusted to be from 48 to 56% and, particularly, from 49 to 54%. That is, the greater the relative density, the greater the tendency for suppressing the growth of silicon nitride crystals during the firing. Upon setting the relative density to lie within the above-mentioned range, therefore, the average long-axis diameter of the columnar crystals of silicon nitride can be set to lie within a desired range. The relative density can be calculated in compliance with the following formula from a bulk density of the molded article after the binder is removed. (The bulk density is calculated from the weight and the volume of the molded article, in which the binder is removed, measured by the Archimedes' method.)

$$\text{Relative density } (\%) = \frac{\text{the bulk density}}{\text{the theorical specific gravity}} \times 100$$

The relative density can be easily controlled relying upon the pressure of molding and the like. According to the present invention, upon controlling the relative density of the molded article as described above, the average long-axis diameter of the columnar crystals of silicon nitride can be adjusted to lie within a predetermined range and, as a result, the heat conductivity of the insulating board can be enhanced to be not smaller than 50 W/m·K.

The firing is executed in a non-oxidizing atmosphere such as nitrogen or argon at a temperature of from 1500 to 1800° C., preferably, from 1600 to 1750° C. and, most preferably, from 1650 to 1750° C. in order to obtain a desired insulating board. When the firing temperature is not higher than 1500° C., it is not allowed to obtain a sintered product having a relative density of not smaller than 90%. When the firing temperature is not lower than 1800° C., the silicon nitride is decomposed causing the fired surface (as fired surface) of the sintered product to be coarsened and the strength to be decreased. Here, if a circuit pattern of an electrically conducting paste is formed on the surface of the green sheet, a circuit is formed on the surface of the insulating substrate simultaneously.

According to the present invention, the firing is conducted at a temperature of not higher than 1800° C. without almost permitting the silicon nitride to be decomposed during the firing. Therefore, the firing can be conducted under normal pressure (atmospheric pressure) instead of under an elevated pressure condition. Besides, the fired surface of the insulating board is little coarsened and, as described earlier, its maximum surface roughness (Rmax) is not larger than 10 μm and, particularly, not larger than 7 μm, making it possible to omit the step of polishing the surface of the obtained insulating board. According to the present invention, therefore, the cost of firing is lowered, the production process is partly omitted, and the cost of production is greatly decreased, offering great advantages.

Besides, the firing is conducted until the relative density becomes not smaller than 90%. It is further desired that the firing time is adjusted depending upon the firing temperature so that the relative density becomes from 90 to 98.5% and, particularly, from 95 to 98%. That is, the sintered product of silicon nitride having a relative density lying within the above-mentioned range exhibits a Young's modulus at room temperature of not larger than 300 GPa and, particularly, within a range of from 250 to 300 GPa. As described earlier, the sintered product having such a small Young's modulus exhibits properties that are most favorable as an insulating board for the wiring board for a power module.

According to the present invention, after the firing, the sintered product (insulating board) is maintained at a temperature of from 1100 to 1600° C., which is lower than the firing temperature for not less than one hour and, particularly, for not less than three hours, in order to enhance the heat conductivity of the insulating board to be not smaller than 50 W/m·K. That is, through the heat-treatment after the firing, magnesium in the grain boundaries is crystallized. Accordingly, the amount of the glass phase having a low heat conductivity remaining in the grain boundaries decreases, and the heat conductivity of the sintered product is enhanced. The temperature of crystallization in the grain boundary phase is about 1200° C. When the temperature of the heat treatment is lower than 1100° C., therefore, the crystallization is not accomplished. When the treatment time is shorter than one hour, furthermore, the crystallization is effected insufficiently. In either case, it becomes difficult to enhance the heat conductivity. Besides, the heat treatment may be effected in a step of cooling after the firing has been finished. Or, the insulating board that is obtained may be once cooled down to room temperature and may then be heated and maintained in a predetermined temperature range.

According to the present invention as described above, the heat conductivity of the insulating board can be increased to be not smaller than 50 W/m·K by adjusting the relative density of the molded article that is to be subjected to the sintering or by conducting the heat treatment after the firing.

(Wiring Board)

The above-mentioned insulating board has a heat conductivity of not smaller than 50 W/m·K, exhibits very excellent heat-radiating property, and has a large strength, e.g., a three-point bending strength (room temperature) of, for example, not smaller than 700 MPa and, particularly, not smaller than 750 MPa. Accordingly, the wiring board of the present invention equipped with such an insulating board is very useful as a wiring board for a semiconductor package in which a semiconductor element will be mounted and as a wiring board for a power module on which a power element will be mounted. In particular, the insulating board having a Young's modulus (room temperature) of not larger than 300 GPa has a very large strength despite its thickness is not larger than 1 mm, and further withstands the deflection, lending itself well for being used for the wiring board for a power module.

FIG. 1 illustrates the structure of a wiring board for a power module according to the present invention. The wiring board (generally designated at A) is equipped with an insulating board 1. A metal circuit 2 is formed on the front surface (upper surface) on one side of the insulating board 1. A power element 3 such as IGBT or MOSFET is mounted on the metal circuit 2, and is electrically connected to the metal circuit 2 by bonding wires such as of aluminum. A heat-radiating plate 5 made of a highly heat-conducting material is attached to the other surface (lower surface) of the insulating board 1 to efficiently radiate the heat generated accompanying the operation of the power element 3. Moreover, the wiring board A is mounted on a heat sink 6 so that heat is more efficiently radiated.

In the wiring board A, the metal circuit 2 is formed of a metal foil or a metal plate of a low-resistance metal such as Cu, Al or Au and, desirably, has a thickness of not smaller than 0.1 mm and, particularly, not smaller than 0.2 mm. When the metal circuit 2 is formed by using a high-resistance metal such as tungsten or molybdenum or when the metal circuit 2 has a thickness smaller than 0.1 mm, the metal circuit 2 generates heat when a heavy current of not smaller than 10 μamperes flows often causing the circuit to be broken. The metal circuit 2 is firmly adhered onto the insulating board 1 by laminating a metal foil or a metal plate of the above-mentioned low-resistance metal having a predetermined thickness on the insulating board 1 by using a brazing material containing at least one kind of an active metal selected from the group consisting of Ti, Zr and Hf, such as a paste containing an active metal such as Cu—Ag— Ti or Cu—Au—Ti, and printing the metal circuit 2 thereon at 800 to 900° C. under the application of a pressure. After the printing, a resist is applied onto the metal foil or the metal plate, followed by exposure to light, developing, and etching. Then, the resist is peeled off so that the metal circuit 2 of a desired pattern is formed on the insulating board 1. At the time of preparing the insulating board 1, the metal circuit may be formed simultaneously with the molded article (green sheet) by firing.

To mount the power element 3 on the metal circuit 2, a solder paste is applied onto the metal circuit 2 and is heated at 300 to 400° C. by using an automatic mounting device to braze the power element 3 onto the metal circuit 2.

The heat-radiating plate 5 is formed of a highly heat-conducting metal such as Cu, Al or Ag. Like when the metal circuit 2 is formed, the heat-radiating plate 5 is firmly adhered onto the insulating board 1 by laminating a metal plate by using a paste of a brazing material containing an active metal, and printing the metal plate thereon at 800 to 900° C. under the application of a pressure.

To mount the wiring board A having the heat-radiating plate 5 on the heat sink 6, a solder paste such as Pb—Sn eutectic solder may be applied onto the heat-radiating plate 5 to braze it at 300 to 400° C.

The insulating board 1 must have a low heat resistance so that heat generated when the power element 3 is operated is efficiently transmitted to the heat-radiating plate 5 and to the heat sink 6. Therefore, the thickness of the insulating board 1 must be smaller than 1 mm and, particularly, smaller than 0.8 mm.

In the wiring board for power module of the present invention, the insulating board 1 is formed of the above-mentioned sintered product of silicon nitride having very excellent heat-radiating property as represented by a heat conductivity of not smaller than 50 W/m·K. Therefore, heat generated by the operation of the power element 3 can be efficiently conducted to the heat-radiating plate and the heat sink 6. It is further desired to so adjust the relative density that the insulating board 1 exhibits the Young's modulus at room temperature of not larger than 300 GPa and, particularly, within a range of from 250 to 300 GPa.

That is, a large load is exerted on the insulating board 1 when the power element 3 is mounted on the insulating board, when the heat-radiating plate 5 is mounted thereon, or when the heat sink 6 is attached to the wiring board A. When used as a control board being mounted on a vehicle, furthermore, the wiring board A is used under severe conditions where load is exerted at all times. Here, however, the insulating board 1 has been formed having a very small thickness in order to decrease the heat resistance. When a load is exerted, therefore, the insulating board 1 tends to develop cracks and is damaged or causes the circuit formed thereon to be broken. According to the present invention, however, the above-mentioned sintered product having a small Young's modulus is used as the insulating board effectively solving the above-mentioned problem. That is, the insulating board 1 formed of the sintered product of the silicon nitride deflects quite easily when a load is exerted thereon, and stress is relaxed owing to the deflection. Besides, the insulating board 1 has a bending strength (room temperature) of not smaller than 700 MPa and, particularly, not smaller than 750 MPa and maintains a sufficiently large strength against the deflection despite its thickness is as small as not larger than 1 mm and, particularly, not larger than 0.8 mm. Therefore, the wiring board A of the present invention having the insulating board 1 formed of such a sintered product does not almost develop cracks despite a large load is exerted thereon, and is effectively prevented from being damaged or from breaking the circuit when the power element 3, heat-radiating plate 5 or heat sink 6 is mounted. Even when used as a control board under severe conditions being mounted on a vehicle or the like, furthermore, there occurs no malfunction that stems from the breakage of the substrate or the breakage of the circuit, and a very high reliability is maintained.

The above-mentioned example of FIG. 1 has dealt with the wiring board for a power module. However, the wiring board of the present invention is not limited thereto only but can be used as a variety of wiring boards where heat-radiating performance is required. For instance, the invention can be adapted to wiring boards having thicknesses of larger than 1 mm, too.

The invention will be described below by way of the experimental examples.

In the following experimental examples, the heat conductivity of a sample of sintered product having a thickness of larger than 1 mm was found in a manner as described below. That is, a reference sample having a thickness of 3 mm was separately prepared and was measured for its heat conductivity (reference heat conductivity) in compliance with JIS-R-1611. Then, the reference heat conductivity was corrected depending upon the thickness of a desired sample of sintered product. Furthermore, a sample of sintered product having a thickness of not larger than 1 mm was calculated from a thermal diffusivity that was measured in compliance with "A Method of Measuring Two-Dimensional Thermal Diffusivity based on a Flash Method", Tadahiko Azumi, thesis of the 9th Symposium by Japanese Association of Thermal Properties, pp. 184–186.

(Experiment 1)

Oxides of rare earth elements, $MgCO_3$ and $Al_2O_3$ were added to a starting material powder of silicon nitride having an average particle diameter of 1.2 $\mu m$, an oxygen content of 1.3% by weight and an $\alpha$-$Si_3Ni_4$ content of 93% prepared by the direct nitration method so as to obtain molded article compositions shown in Tables 1 and 2. To the mixture powders were added a paraffin wax as a binder for molding and an isopropyl alcohol as a solvent, followed by kneading and drying. Then, the mixtures were passed through a sieve to obtain particles for molding. The particles were then molded into disks having a diameter of 12 mm and a thickness of 5 mm through a metal mold press under a molding pressure of 1 ton/$cm^2$.

From the thus obtained molded articles were removed the binder at a predetermined temperature. The molded articles were then fired in a nitrogen atmosphere under normal pressure (atmospheric pressure) at temperatures shown in Tables 1 and 2 for 3 hours, and were further heat-treated under the conditions shown in Tables 1 and 2 to prepare sintered products of silicon nitride to use them as samples for evaluation.

The thus obtained samples for evaluation which were sintered products of silicon nitride were measured for their densities by the Archimedes, method, and relative densities (%) which are ratios to the theoretical density were calculated. Then, the heat conductivities were measured according to the method described above. Furthermore, samples having relative densities of not smaller than 90% were measured for their surfaces by X-ray diffraction to identify the grain boundary crystal phases presuming that there exist crystal phases other than the silicon nitride on the grain boundaries. The fired surfaces were measured for their three-point bending strengths at room temperature (25° C.) in accordance with JIS-R-1601. The fired surfaces were further measured for their surface roughness Rmax. The results were as shown in Tables 1 and 2.

TABLE 1

| Sample No. | $RE_2O_3$ + $Si_3N_4$ (mol %) | MgO (mol %) | $RE_2O_3$/MgO | Kind of RE | $Al_2O_3$ (mol %) | Firing temp. (° C.) | Heat-treating Temp. (° C.) | Time (hr) | Relative density (%) | Heat conductivity (W/mK) | Strength (MPa) | Surface roughness (Rmax) ($\mu m$) | Grain boundary crystal phase | |
|---|---|---|---|---|---|---|---|---|---|---|---|---|---|---|
| *1 | 98 | 1.99 | 1 | Y | 0.01 | 1700 | 1500 | 3 | 72 | 22 | 408 | 4.1 | — | |
| 2 | 95 | 4.99 | 1 | Y | 0.01 | 1700 | 1500 | 3 | 90 | 51 | 703 | 4.6 | MS | RS |
| 3 | 94 | 5.99 | 1 | Y | 0.01 | 1700 | 1500 | 3 | 95 | 55 | 789 | 4.9 | MS | RS |
| 4 | 85 | 14.99 | 1 | Y | 0.01 | 1700 | 1500 | 3 | 96 | 56 | 802 | 4.7 | MS | RS |
| 5 | 75 | 24.99 | 1 | Y | 0.01 | 1700 | 1500 | 3 | 96 | 55 | 806 | 4.1 | MS | RS |
| 6 | 70 | 29.99 | 1 | Y | 0.01 | 1700 | 1500 | 3 | 94 | 50 | 770 | 4.8 | MS > MSN | RS |
| *7 | 68 | 31.99 | 1 | Y | 0.01 | 1700 | 1500 | 3 | 92 | 29 | 686 | 4.0 | MS | RS |
| *8 | 85 | 14.99 | 0.05 | Y | 0.01 | 1700 | 1500 | 3 | 86 | 39 | 676 | 4.9 | — | |
| 9 | 85 | 14.99 | 0.1 | Y | 0.01 | 1700 | 1500 | 3 | 93 | 51 | 758 | 4.2 | MS | RS |
| 10 | 85 | 14.99 | 0.5 | Y | 0.01 | 1700 | 1500 | 3 | 95 | 56 | 782 | 4.9 | MS | RS |
| 11 | 85 | 14.99 | 13 | Y | 0.01 | 1700 | 1500 | 3 | 94 | 68 | 774 | 4.6 | MS | RS |
| 12 | 85 | 14.99 | 15 | Y | 0.01 | 1700 | 1500 | 3 | 91 | 50 | 721 | 4.3 | MS | RS |
| *13 | 85 | 14.99 | 18 | Y | 0.01 | 1700 | 1500 | 3 | 85 | 32 | 658 | 4.0 | — | |
| 14 | 85 | 15 | 1 | Y | 0 | 1700 | 1500 | 3 | 95 | 63 | 787 | 4.3 | MS | RS |
| 15 | 85 | 14.9 | 1 | Y | 0.1 | 1700 | 1500 | 3 | 96 | 53 | 798 | 4.4 | MS | RS |
| 16 | 85 | 14.5 | 1 | Y | 0.5 | 1700 | 1500 | 3 | 96 | 52 | 804 | 4.3 | MS | RS |
| 17 | 85 | 14 | 1 | Y | 1.0 | 1700 | 1500 | 3 | 96 | 50 | 814 | 4.5 | MS | RS |
| *18 | 85 | 13.64 | 1 | Y | 1.36 | 1700 | 1500 | 3 | 97 | 30 | 821 | 4.7 | | RS |

MS stands for $MgSiO_3$, MSN stands for $MgSiN_2$, and RS stands for $RE_2Si_3O_3N_4$.

TABLE 2

| Sample No. | Si₃N₄ (mol %) | RE₂O₃ + MgO (mol %) | RE₂O₃/ MgO | Kind of RE | Al₂O₃ (mol %) | Firing temp. (° C.) | Heat-treating Temp. (° C.) | Time (hr) | Relative density (%) | Heat conduc- tivity (W/mK) | Strength (MPa) | Surface roughness (Rmax) (μm) | Grain boundary crystal phase | |
|---|---|---|---|---|---|---|---|---|---|---|---|---|---|---|
| 19 | 85 | 14.99 | 1 | Ce | 0.01 | 1700 | 1500 | 3 | 94 | 56 | 770 | 4.5 | MS | RS |
| 20 | 85 | 14.99 | 1 | Sm | 0.01 | 1700 | 1500 | 3 | 95 | 56 | 779 | 4.7 | MS | RS |
| 21 | 85 | 14.99 | 1 | Nd | 0.01 | 1700 | 1500 | 3 | 93 | 55 | 753 | 4.9 | MS | RS |
| 22 | 85 | 14.99 | 1 | Gd | 0.01 | 1700 | 1500 | 3 | 94 | 56 | 770 | 4.6 | MS | RS |
| 23 | 85 | 14.99 | 1 | Dy | 0.01 | 1700 | 1500 | 3 | 95 | 58 | 787 | 4.6 | MS | RS |
| 24 | 85 | 14.99 | 1 | Er | 0.01 | 1700 | 1500 | 3 | 96 | 59 | 804 | 5.2 | MS | RS |
| 25 | 85 | 14.99 | 1 | Yb | 0.01 | 1700 | 1500 | 3 | 96 | 59 | 810 | 4.8 | MS | RS |
| 26 | 85 | 14.99 | 1 | Lu | 0.01 | 1700 | 1500 | 3 | 96 | 59 | 816 | 5.5 | MS | RS |
| *27 | 85 | 14.99 | 1 | Y | 0.01 | 1700 | — | — | 96 | 47 | 803 | 4.2 | | RS |
| *28 | 85 | 14.99 | 1 | Y | 0.01 | 1700 | 1000 | 3 | 95 | 48 | 792 | 4.4 | | RS |
| 29 | 85 | 14.99 | 1 | Y | 0.01 | 1700 | 1100 | 3 | 95 | 53 | 787 | 4.8 | MS | RS |
| 30 | 85 | 14.99 | 1 | Y | 0.01 | 1700 | 1600 | 3 | 96 | 55 | 801 | 4.6 | MS | RS |
| *31 | 85 | 14.99 | 1 | Y | 0.01 | 1700 | 1700 | 3 | 96 | 48 | 812 | 4.0 | | RS |
| *32 | 85 | 14.99 | 1 | Y | 0.01 | 1700 | 1500 | 0.5 | 95 | 48 | 790 | 4.3 | | RS |
| 33 | 85 | 14.99 | 1 | Y | 0.01 | 1700 | 1500 | 1 | 95 | 51 | 793 | 4.0 | MS | RS |
| 34 | 85 | 14.99 | 1 | Y | 0.01 | 1700 | 1500 | 5 | 96 | 57 | 804 | 4.7 | MS > MS | RS |
| *35 | 85 | 14.99 | 1 | Y | 0.01 | 1640 | 1500 | 3 | 68 | 12 | 379 | 4.9 | — | |
| 36 | 85 | 14.99 | 1 | Y | 0.01 | 1720 | 1500 | 3 | 97 | 69 | 821 | 6.8 | MS | RS |
| 37 | 85 | 14.99 | 1 | Y | 0.01 | 1780 | 1500 | 3 | 99 | 74 | 855 | 9.2 | MS | RS |
| 38 | 85 | 14.99 | 1 | Y | 0.01 | 1820 | 1500 | 3 | 99 | 76 | 682 | 10.7 | MS | RS |

MS stands for $MgSiO_3$, MSN stands for $MgSiN_2$, and RE stands for $RE_2Si_3O_3N_4$.

As will be obvious from the results of Tables 1 and 2, the samples Nos. 1, 7, 8 and 13 of which the amounts of silicon nitride, amounts of $RE_2O_3$+MgO and the ratio $RE_2O_3$/MgO lie outside the ranges of the present invention exhibited decreased relative densities and decreased heat conductivities which were lower than 50 W/m·K. In the sample No. 18 containing aluminum in an amount of not larger than 1.0 mol % inclusive of impurity aluminum contained in the starting material powder, the density was high but the heat conductivity was very small.

When rare earth elements other than Y were used, the similar sintering behavior and high heat conductivities were exhibited.

In the case of the sample No. 27 which was not quite heat-treated and the sample No. 32 which was heat-treated for a half hour, the magnesium-containing crystal phase was not recognized and the heat conductivity decreased.

In the case of the samples that were heat-treated for more than one hour, the grain boundary crystal phase precipitated and the heat conductivity was greatly improved. In the case of the sample No. 34 that was heat-treated for more than 3 hours, there was no change in the heat conductivity.

In the case of the sample No. 28 that was heat-treated at a temperature of lower than 1100° C. and the sample No. 31 that was heat-treated at a temperature of higher than 1600° C., the magnesium-containing crystal phase was not recognized, and the heat conductivity was the same as the heat conductivity of the sample No. 27 that was not heat-treated.

In the case of the sample No. 35 that was fired at a temperature of lower than 1650° C., the relative density decreased and in the case of the sample No. 38 that was fired at a temperature of higher than 1800° C., the surface roughness (Rmax) increased. In the case of the sample Nos. 2 to 16, 9 to 12, 14 to 17, 19 to 26, 29, 30, 33, 34, 36 and 37, on the other hand, the relative densities were not smaller than 90%, the three-point bending strengths were not smaller than 700 MPa, the surface roughnesses (Rmax) were not larger than 10 μm, and the heat conductivities were not smaller than 50 W/m·K.

(Experiment 2)

Sintering assistants were added to a starting material powder of silicon nitride having an average particle diameter of 1.2 μm, an oxygen content of 1.0% by weight and a β-$Si_3N_4$ content of from 0 to 15% (the remainder being α-$Si_3N_4$) prepared by the direct nitration method so as to obtain compositions shown in Tables 3 and 4. To the mixture powders were added a paraffin wax as a binder for molding and an isopropyl alcohol as a solvent, followed by kneading and drying. Then, the mixtures were passed through a sieve to obtain particles for molding. The particles were then molded into disks having a diameter of 12 mm and a thickness of 5 mm through a metal mold press under a molding pressure of from 0.2 to 2 tons/cm². Furthermore, rectangular parallelepipeds having a size of 60×6×4 mm were molded for measuring the strengths.

From the thus obtained molded articles were removed the binder in a weakly acidic atmosphere at a predetermined temperature. The molded articles were then fired in a nitrogen atmosphere under normal pressure under the firing conditions shown in Tables 3 and 4 to prepare sintered products of silicon nitride to use them as samples for evaluation. The molded articles from which the binder was removed were measured for their densities by the Archimedes's method to calculate their relative densities.

The thus obtained samples were measured for their relative densities, heat conductivities and three-point bending strengths in the same manner as in Experiment 1. Furthermore, the samples were cut from any direction, and the cut surfaces were finished like a mirror surface. Then, the grain boundary phases were etched with a mixed acid of HF+$HNO_3$, and the cut surfaces were photographed using a SEM. Then, the photographs were image-processed depending upon Luzex method to calculate average long-axis diameters of the $Si_3N_4$ crystals. The results were as shown in Tables 3 and 4.

TABLE 3

| Sample No. | $Si_3N_4$ (mol %) | $RE_2O_3$ + MgO (mol %) | $RE_2O_3$/MgO (mol ratio) | Kind of RE | $Al_2O_3$ (mol %) | Amount of β-material added | Relative density of molded article (%) | Firing temp. (°C.) | Firing time (hr) | Relative density (%) | Heat conductivity (W/mK) | Ave. long-axis diameter of $Si_3N_4$ crystals (μm) | Strength (MPa) |
|---|---|---|---|---|---|---|---|---|---|---|---|---|---|
| *1 | 97 | 2.99 | 1 | Er | 0.01 | 0 | 53 | 1700 | 6 | 76 | 27 | 0.88 | 450 |
| 2 | 97 | 2.0 | 0.11 | Er | 1.00 | 0 | 53 | 1700 | 6 | 85 | 29 | 0.85 | 510 |
| 3 | 95 | 4.99 | 1 | Er | 0.01 | 0 | 53 | 1700 | 6 | 93 | 54 | 0.93 | 700 |
| 4 | 90 | 9.99 | 1 | Er | 0.01 | 0 | 53 | 1700 | 6 | 95 | 57 | 0.93 | 730 |
| 5 | 85 | 14.99 | 1 | Er | 0.01 | 0 | 53 | 1700 | 6 | 97 | 58 | 0.92 | 790 |
| 6 | 75 | 24.99 | 1 | Er | 0.01 | 0 | 53 | 1700 | 6 | 98 | 51 | 0.91 | 780 |
| 7 | 70 | 29.99 | 1 | Er | 0.01 | 0 | 53 | 1700 | 6 | 98 | 50 | 0.98 | 770 |
| *8 | 68 | 31.99 | 1 | Er | 0.01 | 0 | 53 | 1800 | 6 | 99 | 30 | 2.40 | 620 |
| *9 | 85 | 14.99 | 0.05 | Er | 0.01 | 0 | 53 | 1800 | 6 | 88 | 30 | 1.92 | 500 |
| 10 | 70 | 29.0 | 0.05 | Er | 1.00 | 0 | 53 | 1800 | 6 | 93 | 26 | 2.02 | 550 |
| 11 | 85 | 14.99 | 0.11 | Er | 0.01 | 0 | 53 | 1700 | 6 | 96 | 51 | 0.65 | 670 |
| 12 | 85 | 14.99 | 0.5 | Er | 0.01 | 0 | 53 | 1700 | 6 | 95 | 56 | 0.72 | 700 |
| 13 | 80 | 14.99 | 1 | Er | 0.01 | 0 | 53 | 1700 | 6 | 97 | 58 | 0.92 | 790 |
| 14 | 85 | 14.99 | 4 | Er | 0.01 | 0 | 53 | 1700 | 6 | 96 | 63 | 0.95 | 810 |
| 15 | 85 | 14.99 | 9 | Er | 0.01 | 0 | 53 | 1700 | 6 | 95 | 65 | 0.89 | 750 |
| 16 | 85 | 14.99 | 13 | Er | 0.01 | 0 | 53 | 1800 | 6 | 95 | 77 | 1.00 | 720 |
| *17 | 85 | 14.99 | 18 | Er | 0.01 | 0 | 53 | 1800 | 6 | 90 | 45 | 1.12 | 600 |
| *18 | 70 | 29.0 | 18 | Er | 1.00 | 0 | 53 | 1800 | 6 | 95 | 39 | 1.25 | 650 |
| 19 | 85 | 14.99 | 1 | Er | 0.01 | 0 | 53 | 1700 | 6 | 97 | 57 | 0.92 | 790 |
| 20 | 85 | 14.9 | 1 | Er | 0.10 | 0 | 53 | 1700 | 6 | 98 | 57 | 0.93 | 800 |
| 21 | 85 | 14.5 | 1 | Er | 0.50 | 0 | 53 | 1700 | 6 | 99 | 55 | 0.95 | 790 |
| 22 | 85 | 14.0 | 1 | Er | 1.00 | 0 | 53 | 1700 | 6 | 99 | 50 | 0.95 | 810 |
| *23 | 85 | 13.7 | 1 | Er | 1.30 | 0 | 53 | 1700 | 6 | 100 | 35 | 1.02 | 810 |

Samples marked with * lie outside the scope of the invention.

TABLE 4

| Sample No. | $Si_3N_4$ (mol %) | $RE_2O_3$ + MgO (mol %) | $RE_2O_3$/MgO (mol ratio) | Kind of RE | $Al_2O_3$ (mol %) | Amount of β-material added | Relative density of molded article (%) | Firing temp. (°C.) | Firing time (hr) | Relative density (%) | Heat conductivity (W/mK) | Ave. long-axis diameter of $Si_3N_4$ crystals | Strength (MPa) |
|---|---|---|---|---|---|---|---|---|---|---|---|---|---|
| 24 | 85 | 14.99 | 1 | Ce | 0.01 | 0 | 53 | 1700 | 6 | 97 | 56 | 0.92 | 760 |
| 25 | 85 | 14.99 | 1 | Sm | 0.01 | 0 | 53 | 1700 | 6 | 96 | 57 | 0.90 | 750 |
| 26 | 85 | 14.99 | 1 | Nd | 0.01 | 0 | 53 | 1700 | 6 | 97 | 57 | 0.95 | 760 |
| 27 | 85 | 14.99 | 1 | Gd | 0.01 | 0 | 53 | 1700 | 6 | 98 | 57 | 0.92 | 770 |
| 28 | 85 | 14.99 | 1 | Dy | 0.01 | 0 | 53 | 1700 | 6 | 98 | 57 | 0.92 | 780 |
| 29 | 85 | 14.99 | 1 | Y | 0.01 | 0 | 53 | 1700 | 6 | 99 | 59 | 0.96 | 800 |
| 30 | 85 | 14.99 | 1 | Yb | 0.01 | 0 | 53 | 1700 | 6 | 99 | 59 | 0.97 | 790 |
| 31 | 85 | 14.99 | 1 | Lu | 0.01 | 0 | 53 | 1700 | 6 | 99 | 60 | 0.96 | 800 |
| 32 | 85 | 14.99 | 1 | Er | 0.01 | 0 | 53 | 1700 | 3 | 95 | 50 | 0.53 | 730 |
| 33 | 85 | 14.99 | 1 | Er | 0.01 | 0 | 53 | 1700 | 8 | 97 | 60 | 1.15 | 740 |
| 34 | 85 | 14.99 | 1 | Er | 0.01 | 0 | 53 | 1700 | 12 | 98 | 67 | 1.53 | 710 |
| 35 | 85 | 14.99 | 1 | Er | 0.01 | 0 | 53 | 1800 | 3 | 97 | 60 | 1.32 | 750 |
| 36 | 85 | 14.99 | 1 | Er | 0.01 | 0 | 53 | 1800 | 6 | 98 | 77 | 2.15 | 650 |
| 37 | 85 | 14.99 | 1 | Er | 0.01 | 0 | 53 | 1800 | 12 | 98 | 84 | 3.12 | 580 |
| *38 | 85 | 14.99 | 1 | Er | 0.01 | 0 | 46 | 1700 | 6 | 88 | 45 | 1.05 | 520 |
| 39 | 85 | 14.99 | 1 | Er | 0.01 | 0 | 49 | 1700 | 6 | 95 | 58 | 0.95 | 770 |
| 40 | 85 | 14.99 | 1 | Er | 0.01 | 0 | 51 | 1700 | 6 | 95 | 58 | 0.93 | 780 |
| 41 | 85 | 14.99 | 1 | Er | 0.01 | 0 | 55 | 1700 | 6 | 95 | 53 | 0.75 | 830 |
| *42 | 85 | 14.99 | 1 | Er | 0.01 | 0 | 57 | 1700 | 6 | 96 | 47 | 0.43 | 860 |
| 43 | 85 | 14.99 | 1 | Er | 0.01 | 5 | 53 | 1700 | 6 | 95 | 62 | 0.98 | 710 |
| 44 | 85 | 14.99 | 1 | Er | 0.01 | 10 | 54 | 1700 | 6 | 90 | 65 | 1.10 | 640 |
| *45 | 85 | 14.99 | 1 | Er | 0.01 | 15 | 55 | 1700 | 6 | 83 | 48 | 1.21 | 530 |

Samples marked with * lie outside the scope of the invention.

As shown in Tables 3 and 4, the sample Nos. 3 to 7, 11 to 16, 19 to 22, 24 to 36, 39 to 41, 43 and 44 exhibited excellent properties such as heat conductivities of not smaller than 50 W/m·K and, particularly, not smaller than 55 W/m·K and strengths of not smaller than 600 MPa and, particularly, not smaller than 700 MPa.

According to the results of the samples Nos. 1 to 8, when the total amount of the rare earth element and magnesium was smaller than 4 mol %, the relative densities were not increased to be at least 90% and, besides, the heat conductivities dropped. When the total amount of the rare earth element and magnesium exceeded 30 mol %, on the other hand, the densities increased but the heat conductivities became smaller than 50 W/m·K.

According to the results of the samples Nos. 9 to 18, the heat conductivities became smaller than 50 W/m·K when the ratio (molar ratio) $RE_2O_3/MgO$ became smaller than 0.1 or greater than 15.

According to the results of the samples Nos. 19 to 23, the densities increased but the heat conductivities greatly dropped when the content of aluminum exceeded 1 mole %.

In the cases of the samples Nos. 24 to 31 where Ce, Sm, Nd, Gd, Dy, Y, Yb and Lu were used as rare earth elements in addition to Er, the same sintering properties and heat conductivities were exhibited irrespective of the kind of the rare earth element provided the same compositions were prepared in terms of a molar ratio.

According to the results of the samples Nos. 32 to 37, when the holding time of the firing temperature (firing time) was changed, the average long-axis diameters changed on the cut surfaces, and the heat conductivities changed. Besides, the strength decreased greatly when the average long-axis diameter exceeded 3 μm.

According to the results of the samples Nos. 38 to 42, the growth of crystalline particles of silicon nitride changed depending upon a change in the density of the molded article. When the density of the molded article was too small, the sintered product thereof was not dense enough. When the relative density of the molded article was not smaller than 48%, the relative density of the sintered product could be increased to be not smaller than 90%. When the molded article has a low density, furthermore, the particles easily grow and the heat conductivity is improved. When the density of the molded article exceeds 56%, the average long-axis diameter becomes smaller than 0.5 μm and the heat conductivity becomes smaller than 50 W/m·K.

According to the results of the samples No. 43 to 45, the growth of the particles was promoted, the average long-axis diameter of the sintered particles of silicon nitride increased and the heat conductivity was improved with an increase in the amount of the β-silicon nitride in the starting material of silicon nitride. When the amount of the β-silicon nitride exceeded 10%, however, the density decreased, the relative density became smaller than 90%, and the heat conductivity decreased, too.

(Experiment 3)

Figure 2:
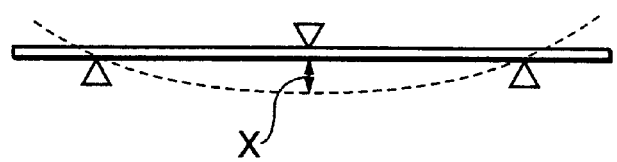
FIG. 2 is a diagram illustrating how to measure the amount of deflection of an insulating board.

Insulating boards having a thickness of 0.635 mm were prepared quite in the same manner as the samples prepared in Experiments 1 and 2. Each insulating board was supported at two points by spans provided maintaining a gap of 30 mm as shown in FIG. 2 in compliance with the three-point bending strength testing method stipulated under JIS-R-1601. Stress was exerted on each insulating board on a central portion on the side opposite to the supported surface, and the amount of deflection x was measured at the time when the board was broken. Furthermore, each insulating board was measured for its Young's modulus (room temperature: ° C.) based on the ultrasonic pulse method. The results were as shown in Table 5.

Furthermore, a copper plate having a thickness of 200 μm was joined to the board by the active metal method, and a metal circuit of copper was formed by etching. Thereafter, a power element was mounted on the metal circuit by soldering by using an automatic mounting device thereby to prepare a wiring board.

Immediately after the power element was mounted, the wiring board was checked for the presence of cracks. To evaluate the mounting, the number of the wiring boards that developed cracks was counted among the twenty wiring boards. The results were as shown in Table 5.

Table 5 also shows the three-point bending strengths and the relative densities of the sintered products measured in Experiments 1 and 2.

TABLE 5

| Experiment No. - Sample No. | Relative density (%) | Strength (MPa) | Young's modulus (Gpa) | Amount of deflection (mm) | Evaluation of mounting |
|---|---|---|---|---|---|
| 1-2 | 90 | 703 | 245 | 2.32 | 1/20 |
| 1-3 | 95 | 789 | 275 | 2.40 | 0/20 |
| 1-4 | 96 | 802 | 283 | 2.25 | 0/20 |
| 1-5 | 96 | 806 | 281 | 2.24 | 0/20 |
| 1-6 | 94 | 770 | 265 | 2.64 | 0/20 |
| 1-9 | 93 | 758 | 263 | 2.77 | 0/20 |
| 1-10 | 95 | 782 | 269 | 2.51 | 0/20 |
| 1-11 | 94 | 774 | 265 | 2.61 | 0/20 |
| 1-12 | 91 | 721 | 252 | 2.50 | 0/20 |
| 1-14 | 95 | 787 | 277 | 2.40 | 0/20 |
| 1-15 | 96 | 798 | 285 | 2.26 | 0/20 |
| 1-16 | 96 | 804 | 289 | 2.19 | 0/20 |
| 1-17 | 96 | 814 | 290 | 2.13 | 0/20 |
| 1-36 | 97 | 821 | 295 | 2.05 | 0/20 |
| 1-37 | 99 | 855 | 315 | 1.78 | 5/20 |
| 1-38 | 99 | 682 | 320 | 1.59 | 9/20 |
| 2-21 | 99 | 790 | 311 | 2.31 | 7/20 |
| 2-22 | 99 | 810 | 310 | 2.18 | 10/20 |
| 2-24 | 97 | 760 | 284 | 2.82 | 0/20 |
| 2-25 | 96 | 750 | 275 | 3.03 | 0/20 |
| 2-26 | 97 | 760 | 289 | 2.77 | 0/20 |
| 2-27 | 98 | 770 | 296 | 2.60 | 0/20 |
| 2-28 | 98 | 780 | 298 | 2.49 | 0/20 |
| 2-29 | 99 | 800 | 305 | 2.28 | 5/20 |
| 2-30 | 99 | 790 | 310 | 2.32 | 8/20 |
| 2-31 | 99 | 800 | 311 | 2.24 | 6/20 |
| 2-32 | 95 | 730 | 272 | 2.68 | 0/20 |
| 2-33 | 97 | 740 | 285 | 2.73 | 0/20 |
| 2-34 | 98 | 710 | 293 | 2.20 | 0/20 |
| 2-35 | 97 | 750 | 287 | 2.90 | 0/20 |
| 2-36 | 98 | 650 | 297 | 1.56 | 15/20 |
| 2-37 | 98 | 580 | 298 | 1.11 | 20/20 |
| 2-44 | 90 | 640 | 250 | 1.77 | 7/20 |

The results of Table 5 tell that the samples having three-point bending strengths of not smaller than 700 MPa and Young's moduli of not larger than 300 GPa, deflect greatly, offering mounting property that can be evaluated to be favorable.

What is claimed is:

1. A wiring board equipped with an insulating board formed of a sintered product of silicon nitride containing a silicon nitride crystal phase, and a metal circuit formed on said insulating board, wherein said sintered product of silicon nitride contains a rare earth element (RE) and magnesium in a total amount of from 4 to 30 mol % calculated as oxides and at a molar ratio ($RE_2O_3/MgO$) calculated as oxides of from 0.1 to 15, and has a relative density of not smaller than 90% and a heat conductivity of not smaller than 50 W/m·K.

2. A wiring board according to claim 1, wherein said sintered product of silicon nitride contains aluminum in an amount of not larger than 1.0 mol % calculated as an oxide.

3. A wiring board according to claim 1, wherein said sintered product of silicon nitride contains a crystal phase of $MgSiO_3$ or $MgSiN_2$ in the grain boundary phase of silicon nitride crystal phase.

4. A wiring board according to claim 1, wherein said crystals of silicon nitride contained in said sintered product of silicon nitride are columnar crystals having an average long-axis diameter of from 0.5 to 3 μm.

5. A wiring board according to claim 1, wherein said insulating board has a Young's modulus of not larger than 300 GPa at room temperature.

6. A wiring board according to claim 1, which is used for a power module.

7. A wiring board according to claim 6, wherein said insulating board has a thickness of not larger than 1 mm, and a power element connected to said metal circuit is mounted on the surface of said insulating board.

8. A wiring board according to claim 7, wherein said metal circuit has a thickness of not smaller than 0.1 mm.

9. A wiring board according to claim 7, wherein said metal circuit is joined to the surface of the insulating board by using an active metal.

10. A wiring board equipped with an insulating board formed of a sintered product of silicon nitride containing a silicon nitride crystal phase fired at a temperature less than 1800° C., and a metal circuit formed on said insulating board, wherein said sintered product of silicon nitride contains a rare earth element (RE) and magnesium in a total amount of from 4 to 30 mol % calculated as oxides and at a molar ratio ($RE_2O_3$/MgO) calculated as oxides of from 0.1 to 15, has a relative density of not smaller than 90%, and a heat conductivity of not smaller than 50 W/m·K.

11. A wiring board equipped with an insulating board formed of a sintered product of silicon nitride containing a silicon nitride crystal phase and a metal circuit formed on said insulating board, wherein said sintered product of silicon nitride contains a rare earth element (RE) and magnesium in a total amount of from 4 to 30 mol % calculated as oxides at a molar ratio ($RE_2O_3$/MgO) calculated as oxides of from 0.1 to 15, has a relative density of not smaller than 90%, and a heat conductivity of not smaller than 50 W/m·K, and wherein said crystals of silicon nitride are columnar with an average long-axis diameter of from 0.5 to 3 µm.

* * * * *